United States Patent [19]
Kaufman

[11] Patent Number: 6,027,365
[45] Date of Patent: Feb. 22, 2000

[54] TEST CARD RECEPTACLE AND HEADER

[75] Inventor: John Wilson Kaufman, Hershey, Pa.

[73] Assignee: The Whitaker Corporation, Wilmington, Del.

[21] Appl. No.: 09/086,457

[22] Filed: May 28, 1998

[51] Int. Cl.[7] .................................................. A01R 3/00
[52] U.S. Cl. ............................ 439/489; 439/64; 439/218
[58] Field of Search ................................ 439/609, 59, 64, 439/79, 541.5, 607, 65, 108, 67, 68, 69, 92, 80, 608, 488, 217, 218, 222, 223, 224, 219, 221, 489; 361/737

[56]                 References Cited

U.S. PATENT DOCUMENTS

| 5,288,247 | 2/1994 | Kaufman ................................... 439/607 |
| 5,308,251 | 5/1994 | Kaufman et al. ........................... 439/64 |
| 5,318,452 | 6/1994 | Brennian, Jr. et al. .................... 439/79 |
| 5,330,360 | 7/1994 | Marsh et al. ............................... 439/79 |
| 5,337,220 | 8/1994 | Granitz ...................................... 361/816 |
| 5,364,275 | 11/1994 | Ota et al. ................................... 439/65 |
| 5,399,105 | 3/1995 | Kaufman et al. ........................ 439/609 |
| 5,470,259 | 11/1995 | Kaufman et al. ........................ 439/607 |
| 5,478,260 | 12/1995 | Kaufman et al. ........................ 439/609 |
| 5,599,203 | 2/1997 | Broschard, III ......................... 439/489 |
| 5,643,001 | 7/1997 | Kaufman et al. ........................ 439/159 |
| 5,649,224 | 7/1997 | Scheer ...................................... 395/800 |
| 5,650,916 | 7/1997 | Osaki et al. ............................. 361/737 |
| 5,667,397 | 9/1997 | Broschard, III et al. ............... 439/188 |
| 5,688,130 | 11/1997 | Huang ........................................ 439/79 |
| 5,711,679 | 1/1998 | Spickler et al. ........................... 439/79 |
| 5,725,394 | 3/1998 | Banakis ................................... 439/607 |
| 5,742,479 | 4/1998 | Asakura ................................... 361/737 |
| 5,775,923 | 7/1998 | Tomioka ................................... 439/79 |
| 5,775,937 | 7/1998 | Bricaud et al. ......................... 439/489 |
| 5,795,190 | 8/1998 | Ono ......................................... 439/607 |
| 5,800,192 | 9/1998 | David et al. ............................. 439/188 |
| 5,820,391 | 9/1998 | Delprete et al. ........................... 439/91 |

*Primary Examiner*—Paula Bradley
*Assistant Examiner*—Ross Gushi

[57]                 ABSTRACT

An electrical assembly including an electrical connector and a complementary test module configured for diagnostic testing of a circuit board connected to the connector when a test module is positioned within a receiving mouth of the connector. The connector includes a connector housing having opposed first and second sides and end sides defining a module receiving mouth, and a plurality of conductive electrical terminals disposed in the connector housing and having portions extending into the module receiving mouth. The electrical connector advantageously includes one or more recessed contacts located on the second side of the connector within the module receiving mouth. The recessed contacts have a portion extending within the connector housing and are adapted for electrical connection with a protruding contact on the complementary test module and are adapted to remain spaced from a conventional module. The electrical assembly further includes a conductive shroud encircling the electrical connector housing.

20 Claims, 5 Drawing Sheets

TEST CARD RECEPTACLE AND HEADER

BACKGROUND OF THE INVENTION

The present invention relates to electrical assembly including an electrical connector and an electrical test module. More specifically, the invention relates to an electrical assembly including an electrical connector having recessed contacts adapted for electrical connection with protruding contacts on a test module for diagnostic testing of a circuit board connected to the electrical connector and adapted to remain spaced from a conventional module.

An example of a conventional electrical connector and grounding shroud therefor is disclosed in U.S. Pat. No. 5,478,260, (hereinafter the '260 patent) issued on Dec. 26, 1995, to John W. Kaufman et al. The invention disclosed in the '260 patent includes an electrical connector assembly for a card reader including a housing having opposed major and minor sides that define a card receiving mouth. The connector has a plurality of conductive electrical terminals disposed in the housing with portions extending into the receiving mouth. The invention disclosed in the '260 patent further includes a conductive shroud encircling the housing that has inwardly spaced contact portions extending into the mouth along at least one of the major sides of the housing. The conductive shroud includes shroud contact portions being spaced from the electrical terminal portions when the shroud is assembled to the housing. The inwardly spaced contact portions are spring fingers extending into the mouth from an edge of the shroud or dimples expressed into the mouth from an outer surface of the shroud. At least one of the major walls of the housing includes a plurality of shroud contact receiving recesses adapted to receive the shroud contact portions. The shroud contact portions are closely adjacent a card receiving space thereby being positioned to be either electrically engaged by corresponding raised conductive surfaces on an outwardly facing conductive surface of a shielded card upon insertion of the shielded card into the mouth, or to remain spaced from surfaces of an unshielded card upon inserting the unshielded card into the mouth.

The electrical connector is electrically connected to a circuit board. Conventionally, in order to perform diagnostic tests on the circuit board, the device in which the connector and circuit board is housed must be disassembled to gain access to the circuit board. This procedure is labor intensive and therefore costly.

Consequently, a need exists for an electrical connector that is configured to allow diagnostic testing on a circuit board without disassembling the device. Further, there exists a need for a complementary test card that fits within the electrical connector and is configured to electrically receive the diagnostic information from the electrical connector. The electrical connector should be able to accept both the test card and a conventional card so as not to interfere with the normal operation of the electrical connector.

SUMMARY OF THE INVENTION

The present invention provides a novel electrical connector assembly designed to satisfy the aforementioned needs. The invention embodies an electrical assembly including an electrical connector having recessed contacts adapted for electrical connection with protruding contacts on a test module for diagnostic testing of a circuit board connected to the electrical connector, and adapted to remain spaced from a conventional module.

Accordingly, the present invention relates to an electrical assembly including an electrical connector and a complementary test module configured for diagnostic testing of a circuit board connected to the electrical connector when a test module is positioned within a receiving mouth of the electrical connector. The electrical connector includes a connector housing having opposed first and second sides and end sides defining a module receiving mouth, and a plurality of conductive electrical terminals disposed in the connector housing and having portions thereof extending into the module receiving mouth. The electrical connector advantageously includes one or more recessed contacts located on the second side of the electrical connector within the module receiving mouth. The recessed contacts each have a portion extending within the connector housing and are each adapted for electrical connection with a corresponding protruding contact on the test module and each are adapted to remain spaced from a conventional module.

The electrical test module includes a module housing having a mating side, a first side adjacent the mating side, and a second side adjacent the mating side. The mating side has a plurality of recesses for receiving the plurality of conductive electrical terminals of the electrical connector. The recesses do not provide an electrical connection with the electrical terminals, rather they merely act as a mating connection. The second side of the module housing has one or more electrical contacts protruding therefrom for electrical connection to the recessed contacts.

The electrical assembly further includes a conductive shroud encircling the electrical connector housing. The shroud has one or more contact portions extending into the module receiving mouth along the first side of the connector housing. The first side of the connector housing includes one or more shroud contact receiving recesses adapted to receive the shroud contact portions. The first side of the test module has an outwardly facing conductive surface with one or more raised conductive surfaces thereon. The shroud contact portions are thereby positioned to be either electrically engaged by corresponding raised conductive surfaces on an outwardly facing conductive surface of a shielded module upon insertion of the shielded module into the module receiving mouth, or to remain spaced from surfaces of an unshielded module upon inserting the unshielded module into the mouth. The connector assembly of the present invention is, therefore, suitable for use with shielded as well as unshielded modules.

The invention itself, together with further objects and advantages, will best be understood by reference to the following detailed description taken in conjunction with the accompanying drawings.

BRIEF DESCRIPTION OF THE DRAWINGS

FIGS. 1 though 10 are presented by way of illustration and not limitation to depict the preferred embodiments of the present invention. Embodiments including the various aspects of the present invention will now be described in detail with reference to the accompanying drawings.

DETAILED DESCRIPTION OF THE INVENTION

Figure 1:
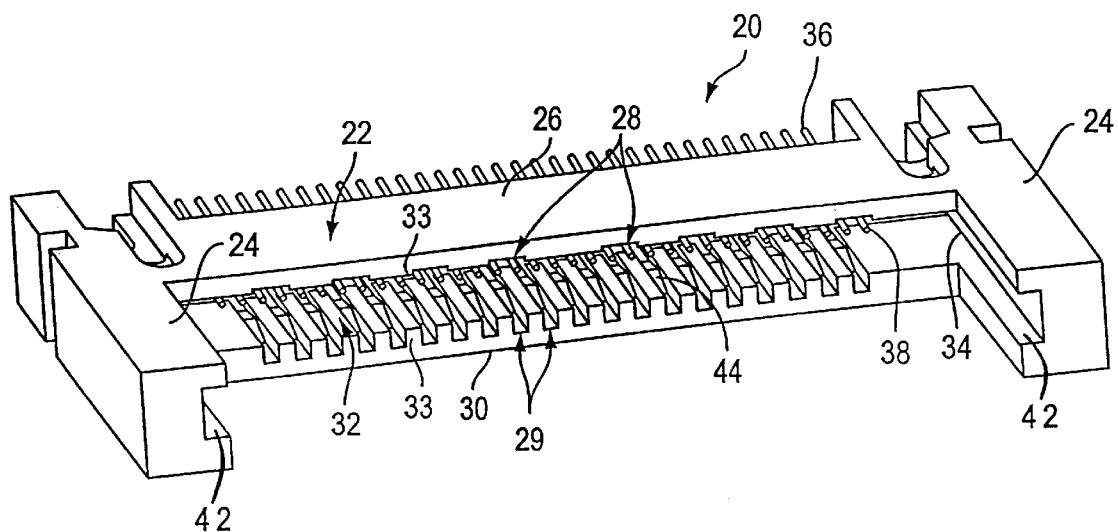
FIG. 1 is a perspective view of an electrical connector according to the present invention.
Figure 2:
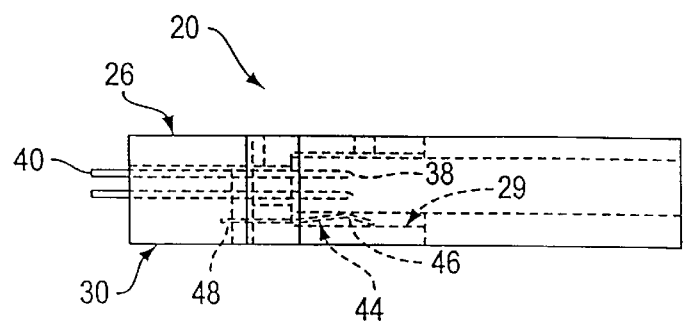
FIG. 2 is a side view of an electrical connector according to the present invention including phantom lines.
Figure 3:
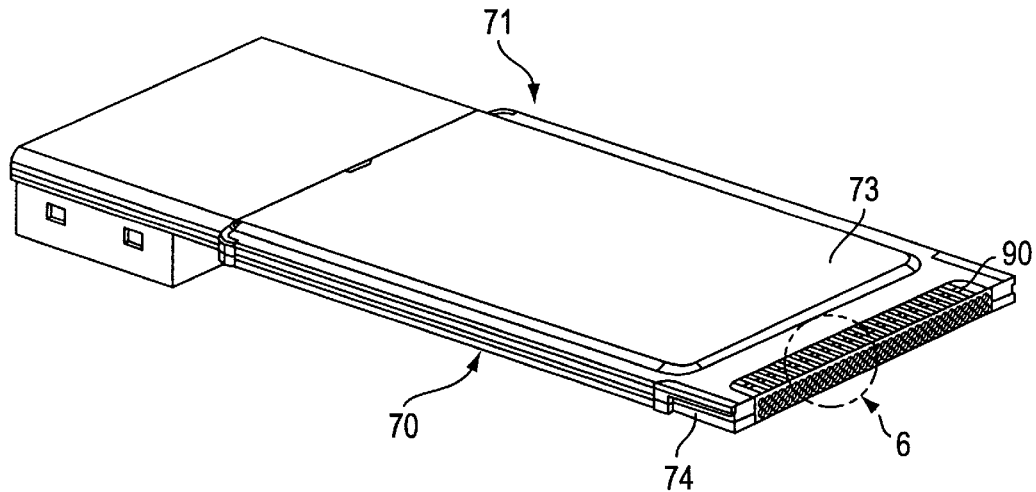
FIG. 3 is a bottom perspective view of a test module according to the present invention.
Figure 4:
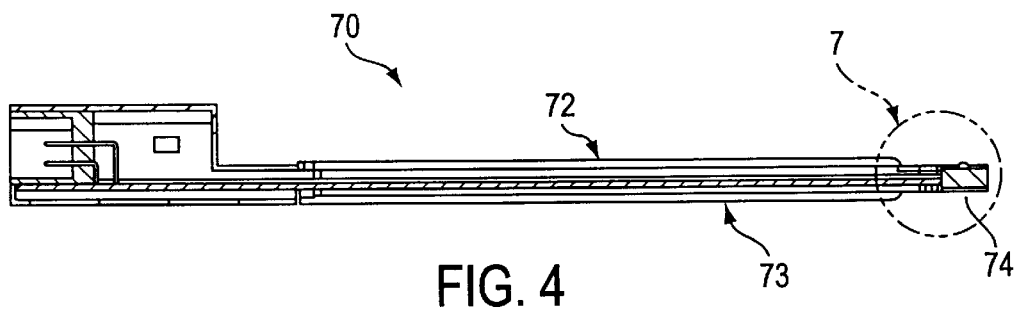
FIG. 4 is a side, cross-sectional view of a test module according to the present invention.
Figure 5:
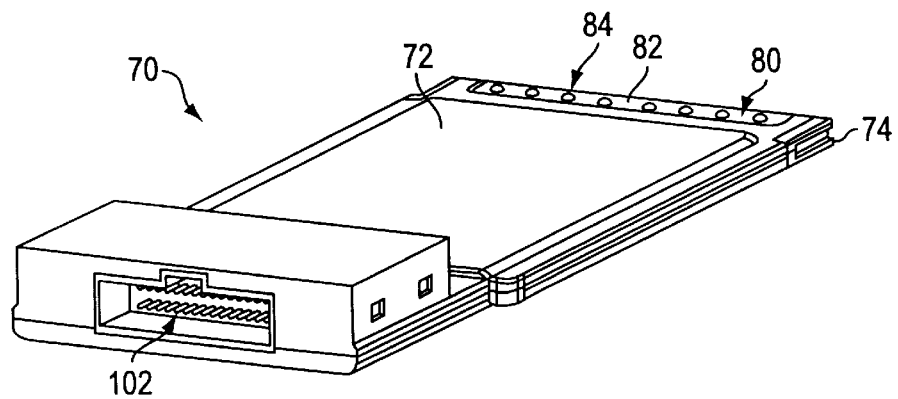
FIG. 5 is a top perspective view of a test module according to the present invention.
Figure 6:
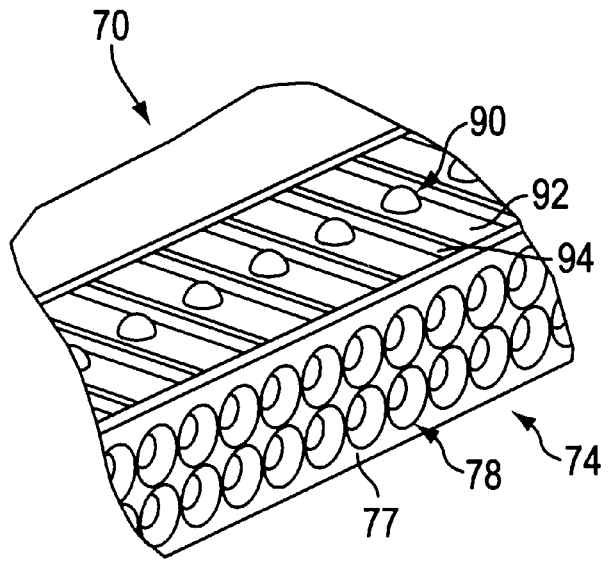
FIG. 6 is an enlarged, perspective view of a portion of a test module according to the present invention as indicated in FIG. 3.

The electrical assembly of the present invention includes an electrical connector 20 depicted in FIGS. 1 and 2, and an electrical test module 70 depicted in FIGS. 3–7.

Referring to FIGS. 1 and 2, the connector 20 of the present invention is configured to receive both a conventional memory card (not depicted), such as a PCMCIA Type II card, and a test module 70. The advantage of such a configuration is that it allows a test module 70 to be inserted within the connector 20 to allow efficient diagnostic testing of a circuit board connected to the electrical connector 20.

Figure 9:
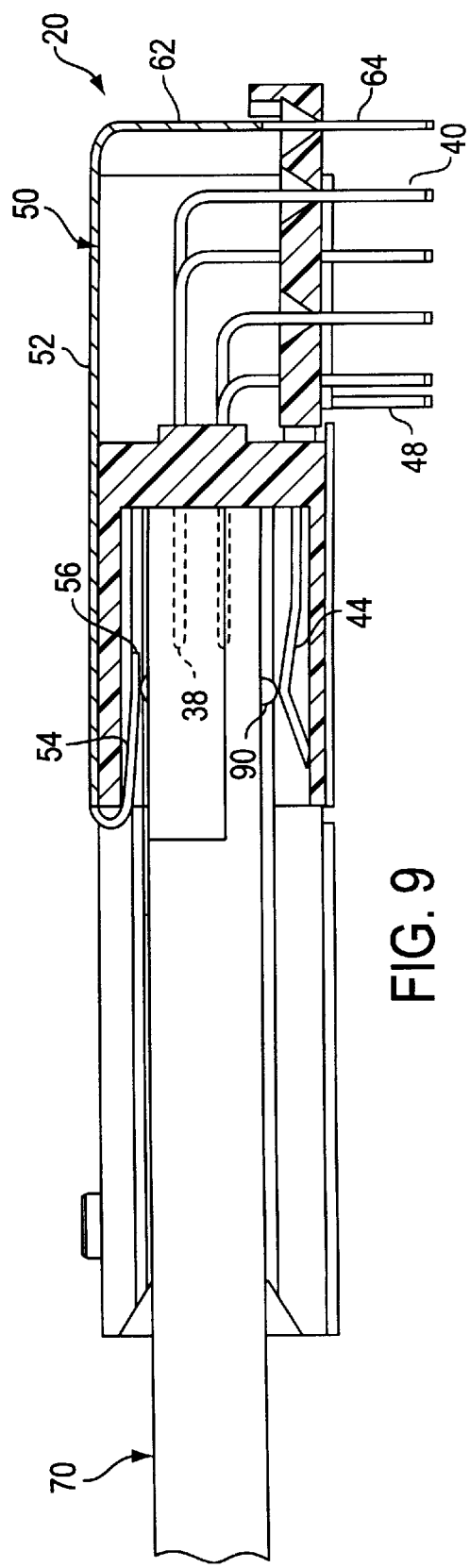
FIG. 9 is a side, cross-sectional view of a test module inserted in a receiving mouth of an electrical connector according to the present invention.

The connector 20 of the present invention includes a housing 22 having a first side 26, an opposing second side 30, and end sides 24 together defining a receiving mouth 32. A portion of the receiving mouth 32 defines a receiving space 34. A plurality of electrical terminals 36 are disposed within the housing 22, and each of the terminals 36 has first and second connecting portions 38, 40 respectively. The first connecting portions 38 extend into the receiving space 34 and are adapted for mating with complementary recesses of the test module 70 or complementary terminals of a conventional memory or PCMCIA card (not depicted). The second connecting portions 40 are terminal pins configured as depicted in FIG. 2, or alternatively as depicted in FIG. 9 as being adapted for being received within respective apertures in a circuit board (not depicted). The connector 20 is mounted on a PC circuit board with an insulating material positioned therebetween.

The first side 26 of the connector housing 22 includes a plurality of finger receiving recesses 28 extending at least partially outwardly to the leading edge 33 of the receiving mouth 32. In the embodiment illustrated, connector 20 further includes a pair of guide arms 42 extending outwardly from the end sides 24 for receiving the test module 70 or memory card.

The second side 30 of the connector housing 22 includes a plurality of receiving recesses 29 extending outwardly toward a leading edge 33 of the module receiving mouth 32. Each receiving recess 29 houses a recessed contact 44 that includes a contacting portion 46 and a connecting portion 48 that extends into the connector housing 22. Each contact 44 provides an electrical circuit that may be used for diagnostic testing of the circuit board electrically connector to the connector 20. Preferably the connector 20 includes twenty contacts 44 each being housed within a separate receiving recess 29 as depicted, although alternative embodiments are also envisioned, for example embodiments including a different number of contacts or embodiments in which contacts share a receiving recess. Preferably the contacts 44 are configured as spring contacts as depicted in FIGS. 1 and 2, although alternative shapes may be used, for example a contact having a U-shaped configuration in which upwardly extending portions pinch the protruding contact 90 on the test module 70.

The contacts 44 are positioned within the receiving recesses 29 such that if a conventional memory card is inserted within the receiving mouth 32, the contacts 44 will not engage any surface of the memory card. The space between the contacts 44 and the memory card prevents any electrical interconnection or interference between the contacts 44 and a conventional memory card. The contacts 44 are positioned within the receiving recesses 29 so that when a test module 70 having protruding contacts 90 is inserted within the receiving mouth 32, the protruding contacts 90 extend within the receiving recesses 29 and electrically engage the contacting portion 46 of the contacts 44.

Figure 8:
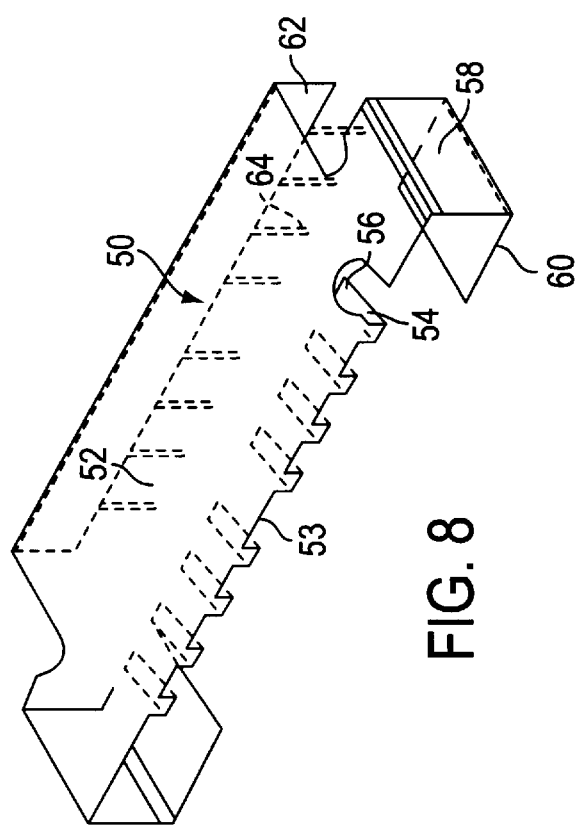
FIG. 8 is a perspective view of a grounding conductive shroud according to the present invention.

Referring to FIGS. 8 and 9, the connector housing 22 of the present invention is preferably configured to receive a grounding conductive shroud 50. The conductive shroud 50 is a unitary member including a top plate surface 52 having a plurality of spring fingers 54 extending from the leading edge 53 thereof. Shroud 50 includes side walls 58 extending from the top plate 52. Shroud 50 further includes lower flanges 60 extending from the side walls 58 and adapted to extend beneath the connector housing 22. The flanges 60 may serve as conductive pads that can be secured and referenced to ground electrical potential by being electrically connected to corresponding pads on a circuit board as discussed in U.S. Pat. No. 5,288,247. Shroud 50 further includes a backwall 62 having a plurality of terminal members 64 extending downwardly therefrom for electrical engagement with ground circuits in the circuit board.

Multiple resilient spring contact fingers 54 extend from the leading edge 53 of the shroud and upon assembly extend into the receiving mouth 32. The leading ends 56 of the spring fingers 54 are adapted to be received in the respective spring finger recesses 28 in the first side 26 of housing 22 whereby the spring fingers 54 lie closely adjacent the receiving space 34. The shield 50 is assembled to the connector 20 by placing the plate 52 over side 26, sliding the fingers 54 into position and wrapping the side edges 58 around the housing 22, as depicted in FIG. 9.

Referring to FIGS. 3–7, the present invention is also directed to an improved test module 70 that may be used provide diagnostic testing of a circuit board connected to the electrical connector 20 of the present invention. The test module of the present invention includes a module housing 71 with a mating side 77, a first side 72 adjacent the mating side 77, and a second side 73 adjacent the mating side 77 and opposite the first side 72. The test module 70 includes a ground plate or conductive surface 80 on the outwardly facing surface or first side 72 of a shielded test module 70. The shield 80 includes top surface 82 having a plurality of raised conductive areas 84 adapted to engage the recessed spring fingers 54 of the shroud 50 upon insertion of the test module 70 into the receiving mouth 32 of the connector 20.

The mating side 77 of the module housing 71 has a plurality of recesses 78 for receiving the plurality of first connecting portions 38 of the electrical terminals 36. Unlike in conventional modules, the recesses 78 do not provide electrical interconnection with the electrical terminals 36. The recesses 78 of the test module 70 of the present invention merely act as a mating connection between the test module 70 and the connector 20. The connection between the recesses 78 and the electrical terminals resists both horizontal and lateral movement therebetween, thereby counteracting the normal forces placed on the test module 70 by the spring contacts 44 and the spring fingers 54. Preferably the test module 70 includes sixty-eight recesses 78, configured in two rows of thirty-four recesses.

The second side 73 of the test module 70 has a plurality of protruding electrical contacts 90. The electrical contacts 90 are positioned on conductive circuits 92 that are preferably separated by an insulating material 94, such as plastic. Preferably the test module includes twenty electrical contacts 90 with corresponding conductive circuits 92 that are oriented to correspond to the spring contacts 44 of the connector 20 and to be in contact therewith when the test module 44 is fully inserted within the receiving mouth 32.

The test module 70 as depicted includes an AMPMODU® system 50 thirty position header 102 manufactured by AMP Incorporated. The details of the header 102 are known and therefore are omitted from the description herein.

Figure 7:
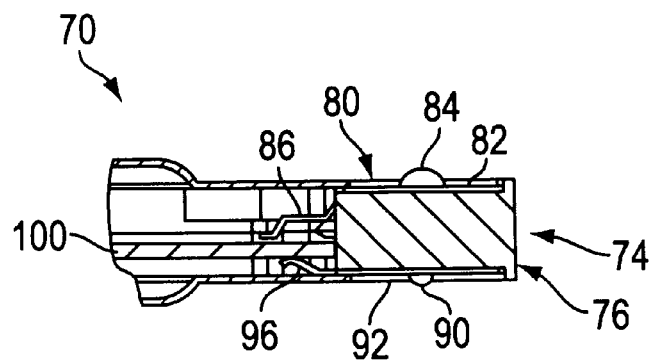
FIG. 7 is an enlarged, side, cross-sectional view of a portion of the test module according to the present invention as indicated in FIG. 4.

FIG. 7 illustrates a cross-sectional view of the test module 70. The test module 70 includes a connector 74 and circuit board 100. The connector 74 includes a housing 76 having the plurality of recesses 78. The ground plate 80 includes a plate-like portion 82 having the plurality of raised conductive surfaces 84 extending at a selected location adjacent an edge thereof, and a corresponding plurality of terminal spring arms 86 extending outwardly from plate 80 along the same edge. Upon assembling the test module 70, spring arms 86 are electrically connected to ground contact pads on circuit board 100. Upon assembling ground plate 80 to the connector housing 76, the spring arms 86 are soldered to the circuit board 100 and the ground path is completed between ground circuits of the card and the corresponding conductive portion 84 on the outer surface 82 of the ground plate 80. For purposes of clarity, solder has been omitted from FIG. 7. The outer cover or housing 72 secures the connector 74 and its associated circuit board 100 therebetween to form the test module 70. The ground plate 80 is spaced and electrically isolated from the surfaces of housing 72. Thus, the housing 72 may be made of insulated or conductive material. To get proper grounding it is important that the ground plate 80 remain electrically isolated from any conductive material that is exposed on the outer surface of the test module 70.

As the test module 70 is inserted into the mouth 32 and into the corresponding receiving portion 34, each of the protruding electrical contacts 90 wipes frictionally against the corresponding spring contact 44 thereby establishing electrical contact and biasing the spring contacts 44 further into the respective receiving recesses 29. Similarly, as the test module 70 is inserted into the mouth 32, each of the raised surfaces 84 wipes frictionally against the leading end 56 of the corresponding spring finger 54 thereby establishing electrical contact between the ground reference plane and biasing the spring contact fingers 54 further into the respective recesses 28.

When a conventional card (not depicted) is inserted into the card receiving slot 34 of the connector 20, since the card includes no protruding contacts 90 or raised conductive surfaces 84, the card can be fully inserted into the card receiving mouth without engaging either the recessed contacts 44 or the recessed spring fingers 54. Thus even if the outer surface of the conventional card is conductive, the recessed contacts 44 and spring fingers 56 remain isolated from the memory card thereby assuring that neither an improper connection nor electromagnetic interference problems are created.

Figure 10:
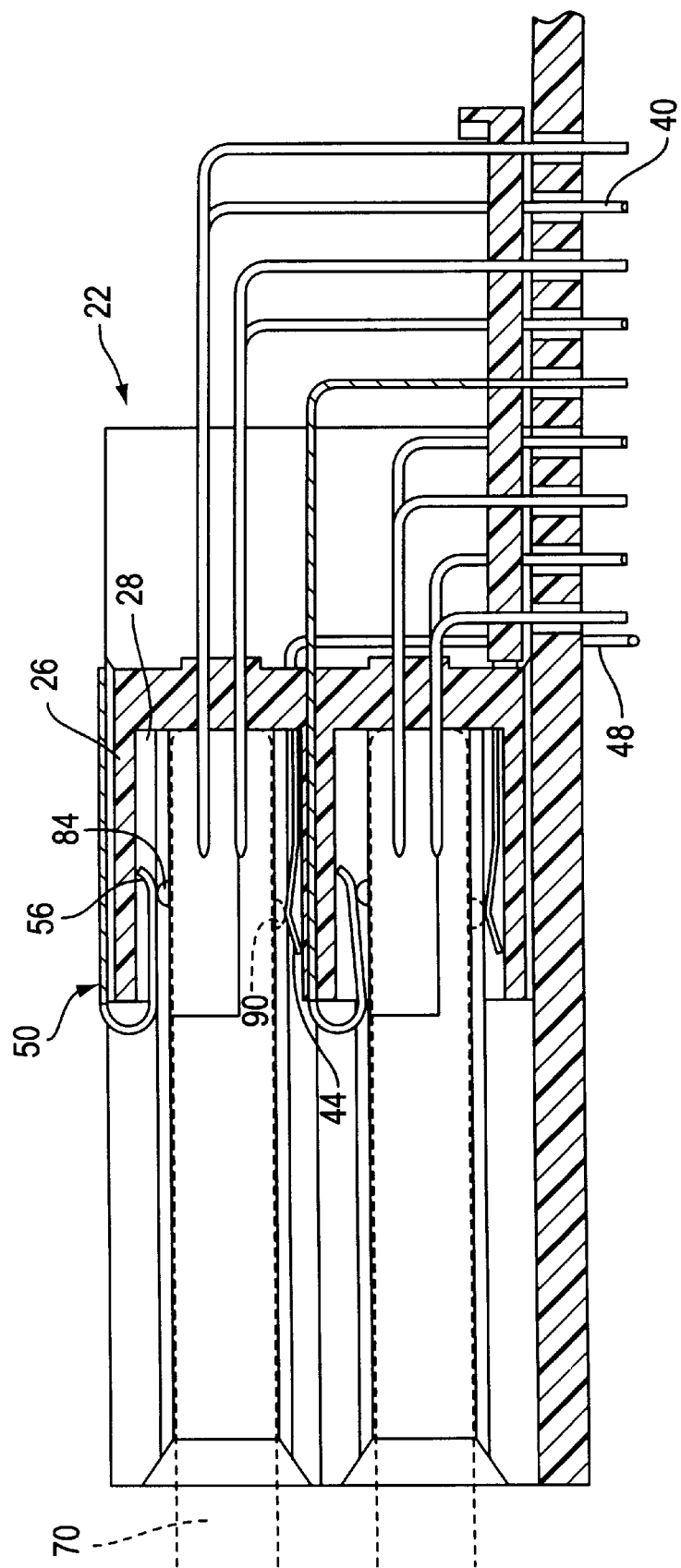
FIG. 10 is a side, cross-sectional view of a pair of test modules inserted in receiving mouths of stacked electrical connectors according to the present invention.

FIG. 10 shows an alternative embodiment of the present invention wherein two connectors 20 are stacked. Note that the spring fingers 56 are recessed within the housing wall 26 and engage the test card 70 of the present invention. The embodiment depicted in FIG. 10 allows cards to be mixed and matched with shielded and unshielded versions as required.

A novel feature of the present invention is the addition of a plurality of recessed contacts 44 that provide a circuit for diagnostic testing of the circuit board connected to the connector 20. The recessed configuration of the contacts 44 allows the connector 20 of the present invention to receive both a conventional memory card (not depicted), such as a PCMCIA Type II, and a test module 70. When a test module 70 is inserted into the receiving mouth 32, an electrical interconnection between a protruding contacts and the spring contacts 44 is produced thereby allowing diagnostic testing of the circuit board. However, when a conventional memory card is inserted into the receiving mouth 32, an electrical interconnection is not made between the card and the spring contacts 44 because the spring contacts are recessed thereby allowing the card to operate in a normal manner.

Of course, it should be understood that a wide range of changes and modifications could be made to the preferred embodiment described above. It is therefore intended that the present invention is not limited to the embodiments described above, but encompasses any and all embodiments within the scope of the following claims, and equivalents thereof.

What is claimed is:

1. An electrical connector for mating with a complementary electrical module and with a test module, said connector comprising:

a housing having a first side, an opposed second side, and end sides defining a module receiving mouth for receiving a complementary electrical module;

a plurality of conductive electrical terminals disposed in said housing and having portions thereof extending into said module receiving mouth and connecting with a complementary electrical module received in said module receiving mouth; and at least one recessed contact located on said second side and within a corresponding recess adjacent to said module receiving mouth, said recessed contact having a test module engaging portion extending within said housing, said test module engaging portion on said recessed contact being adapted for electrical connection with a protruding electrical contact on a test module that is received in said module receiving mouth instead of said complementary electrical module, said recessed contact in said corresponding recess being spaced from said module receiving mouth and adapted to remain spaced from said complementary electrical module that is received in said module receiving mouth, said recessed contact having a circuit board engaging portion for engaging a circuit board to provide electrical interconnection between said test module and the circuit board during diagnostic testing of the circuit board when said test module is received within said module receiving mouth.

2. The electrical connector according to claim 1 further comprising:

a conductive shroud encircling said housing, said shroud having a contact portion extending into said module receiving mouth along said first side of said housing, wherein said first side of said housing includes a shroud contact receiving recess adapted to receive said shroud contact portion.

3. The electrical connector according to claim 1 wherein said recessed contact is located within a receiving recess extending outwardly toward a leading edge of said module receiving mouth.

4. The electrical connector of claim 1, and further comprising: a plurality of recessed contacts located on said second side within said module receiving mouth and electrically connecting with respective protruding electrical contact on said test module that is received in said module receiving mouth instead of said complementary electrical module.

5. An electrical connector according to claim 1 wherein said recessed contact is a spring contact.

6. The electrical connector according to claim 1 wherein said recessed contact is one of twenty recessed spring contacts located on said second side, each of said recessed spring contacts having a test module engaging portion within a receiving recess extending outwardly toward a leading edge of said module receiving mouth, each test module engaging portion of said recessed spring contacts being adapted for electrical connection with a protruding contact on said test module, and each said recessed spring contacts in said receiving recesses being spaced from said module receiving mouth and being spaced from said complementary electrical module that is received in said module receiving mouth.

7. A test module for mating with a complementary electrical connector including a housing having a first side, an opposed second side, and end sides defining a module receiving mouth, a plurality of conductive electrical terminals disposed in the connector housing and having portions thereof extending into the module receiving mouth, and a recessed contact located on the second side within the module receiving mouth, the recessed contact having a portion extending within the connector housing, wherein the recessed contact is adapted for electrical connection with a protruding contact on a test module and wherein the recessed contact is adapted to remain spaced from a conventional module, said test module comprising:

a module housing having a mating side, a first side adjacent said mating side, and a second side adjacent said mating side, said mating side having a plurality of recesses for receiving the plurality of conductive electrical terminals when said test module is position within the receiving mouth, said second side having an electrical contact protruding therefrom for electrical connection to the recessed contact, said test module being configured to allow diagnostic testing of a circuit board connected to the electrical connector when a test module is positioned within the receiving mouth and said electrical contact is electrically engaged to the recessed contact.

8. The test module according to claim 7 wherein:

the electrical connector includes a conductive shroud encircling the connector housing, the shroud having a contact portion extending into the module receiving mouth along the first side of the connector housing, and the first side of the connector housing includes a shroud contact receiving recess adapted to receive the shroud contact portion; and said first side of said test module has an outwardly facing conductive surface with a raised conductive surface thereon, said raised conductive surface being in electrical engagement with the shroud contact portion when said test module is inserted into the module receiving mouth.

9. The test module according to claim 7 wherein said second side of said module housing includes a plurality of electrical contacts protruding therefrom for electrical connection to a plurality of recessed contacts on the second side of the electrical connector within the module receiving mouth, each of the recessed contacts having a portion extending within the connector housing.

10. The test module according to claim 7 wherein said plurality of electrical contacts protruding from said second side of said test module are spaced apart by an insulating material.

11. The test module according to claim 1 wherein said test module includes twenty electrical contacts protruding from said second side of said test module.

12. An electrical assembly comprising:

an electrical connector comprising:

a connector housing having a first side, an opposed second side, and end sides defining a module receiving mouth, a plurality of conductive electrical terminals disposed in said connector housing and having portions thereof extending into said module receiving mouth, and a recessed contact located on said second side of said electrical connector within said module receiving mouth, said recessed contact having a portion extending within said connector housing, said recessed contact being configured to provide electrical interconnection between a test module and a circuit board to allow diagnostic testing of the circuit board connected to said electrical connector when said test module is positioned within said receiving mouth; and an electrical test module comprising a module housing having a mating side, a first side adjacent said mating side, and a second side adjacent said mating side, said mating side having a plurality of recesses for receiving said plurality of conductive electrical terminals, said second side having an electrical contact protruding therefrom for electrical connection to said recessed contact, said test module being configured to allow diagnostic testing of a circuit board connected to said electrical connector when said test module is positioned within said receiving mouth and said electrical contact is electrically engaged to said recessed contact.

13. The electrical assembly according to claim 12 wherein:

said electrical connector includes a conductive shroud encircling said connector housing, said shroud having a contact portion extending into said module receiving mouth along said first side of said connector housing, and said first side of said connector housing includes a shroud contact receiving recess adapted to receive said shroud contact portion; and said first side of said test module has an outwardly facing conductive surface with a raised conductive surface thereon, said raised conductive surface being in electrical engagement with said shroud contact portion when said test module is inserted into said module receiving mouth.

14. The electrical assembly according to claim 12 wherein said second side of said module housing includes a plurality of electrical contacts protruding therefrom for electrical connection to a plurality of recessed contacts on the second side of said electrical connector within said module receiving mouth, each of said recessed contacts having a portion extending within said connector housing.

15. The electrical assembly according to claim 14 wherein said plurality of electrical contacts protruding from said second side of said test module are spaced apart by an insulating material.

16. The electrical assembly according to claim 12 wherein:

said test module includes twenty electrical contacts protruding from said second side of said test module; and said electrical connector includes twenty recessed spring contacts located on said second side of said test module within said module receiving mouth, each of said recessed spring contacts having a portion extending within said connector housing, each of said recessed spring contacts being located within a receiving recess extending outwardly toward a leading edge of said module receiving mouth, each of said recessed spring contacts being adapted for electrical connection with the protruding contact on said electrical module.

17. An improved electrical connector for mating with a complementary electrical module, said connector comprising a housing having a first side, an opposed second side, and end sides defining a module receiving mouth, and a plurality of conductive electrical terminals disposed in said housing and having portions thereof extending into said module receiving mouth, said improvement comprising:

a recessed contact located on said second side within said module receiving mouth, said recessed contact having a portion extending within said housing, said recessed contact being adapted for electrical connection with a protruding contact on a test module and said recessed contact being adapted to remain spaced from a conventional module, said recessed contact being configured to provide electrical interconnection between a test module and a circuit board to allow diagnostic testing of the circuit board connected to said electrical connector when the test module is positioned within said receiving mouth.

18. The electrical connector according to claim 1 wherein said recessed contact is located within a receiving recess extending outwardly toward a leading edge of said module receiving mouth.

19. The electrical connector of claim 1 further comprising a plurality of recessed contacts located on said second side within said module receiving mouth, each of said recessed contacts having a portion extending within said housing.

20. The electrical connector according to claim 17 wherein said recessed contact is a spring contact.

* * * * *